United States Patent
Kim

(10) Patent No.: US 10,408,418 B2
(45) Date of Patent: Sep. 10, 2019

(54) LENS AND LIGHTING DEVICE INCLUDING SAME

(71) Applicant: LG INNOTEK CO., LTD., Seoul (KR)

(72) Inventor: Ki Hyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/765,828

(22) PCT Filed: Oct. 6, 2016

(86) PCT No.: PCT/KR2016/011170
§ 371 (c)(1),
(2) Date: Apr. 4, 2018

(87) PCT Pub. No.: WO2017/065455
PCT Pub. Date: Apr. 20, 2017

(65) Prior Publication Data
US 2018/0299097 A1  Oct. 18, 2018

(30) Foreign Application Priority Data

Oct. 13, 2015 (KR) .................. 10-2015-0142708

(51) Int. Cl.
*F21V 5/04* (2006.01)
*G02B 3/04* (2006.01)
(Continued)

(52) U.S. Cl.
CPC ............ *F21V 5/04* (2013.01); *F21K 9/232* (2016.08); *F21K 9/27* (2016.08); *G02B 3/00* (2013.01);
(Continued)

(58) Field of Classification Search
None
See application file for complete search history.

(56) References Cited

U.S. PATENT DOCUMENTS 5,022,725 A * 6/1991 Matsunami ............... G01J 1/04
250/216
8,313,218 B2 * 11/2012 Hong ......................... F21V 5/00
362/267
(Continued)

FOREIGN PATENT DOCUMENTS

JP  2012-212574  11/2012
KR  10-2009-0100004  9/2009
(Continued)

OTHER PUBLICATIONS

International Search Report (with English Translation) and Written Opinion dated Jan. 17, 2017 issued in Application No. PCT/KR2016/011170.

*Primary Examiner* — Grant S Withers
(74) *Attorney, Agent, or Firm* — KED & Associates, LLP

(57) ABSTRACT

Provided is a lens according to an embodiment that comprises: a light entrance surface; and a light exit surface facing the light entrance surface, wherein the product of the height rate (HR) of the light entrance surface and the HR of the light exit surface on a section in one direction ranges from 1.45 to 1.66, where the HR of the light entrance surface is h0/h1, h0 denotes the distance from a reference line to the light entrance surface corresponding to the central axis, and h1 denotes the height from the reference line to the midpoint of the straight line connecting regions P11 and P12 on the light entrance surface that correspond to points at one-third and two-thirds of the distance from one end of the reference line to the central axis, respectively, and where the HR of the light exit surface is h3/h2, h3 denotes the distance from the reference line to the light exit surface corresponding to the central axis, and h2 denotes the height from the reference line to the midpoint of the straight line connecting regions P21 and P22 on the light exit surface that correspond to (Continued)

points at one-third and two-thirds of the distance from one end of the reference line to the central axis, respectively.

20 Claims, 18 Drawing Sheets

(51) Int. Cl.
*G02B 3/00* (2006.01)
*G02B 3/02* (2006.01)
*F21K 9/232* (2016.01)
*H01L 33/58* (2010.01)
*F21K 9/27* (2016.01)
*F21Y 103/10* (2016.01)
*H01L 25/075* (2006.01)

(52) U.S. Cl.
CPC ............... *G02B 3/02* (2013.01); *G02B 3/04* (2013.01); *H01L 33/58* (2013.01); *F21Y 2103/10* (2016.08); *G02B 2003/0093* (2013.01); *H01L 25/0753* (2013.01)

(56) References Cited

U.S. PATENT DOCUMENTS

| | | | | |
|---|---|---|---|---|
| 2007/0058369 A1* | 3/2007 | Parkyn | .................. | F21V 5/04 362/235 |
| 2008/0068852 A1* | 3/2008 | Goihl | .................. | F21V 5/002 362/509 |
| 2009/0296405 A1* | 12/2009 | Tetsuo | .................. | F21K 9/00 362/308 |
| 2010/0157441 A1* | 6/2010 | Kweon | .................. | G02B 3/02 359/708 |
| 2014/0043694 A1* | 2/2014 | Tsai | .................. | G02B 3/04 359/708 |
| 2015/0041837 A1 | 2/2015 | Chinniah et al. | | |
| 2015/0085386 A1* | 3/2015 | Tanaka | .................. | G02B 13/0045 359/764 |
| 2016/0201880 A1* | 7/2016 | Park | .................. | H01L 33/507 362/84 |
| 2017/0219798 A1* | 8/2017 | Park | .................. | G02B 27/0025 |
| 2017/0234507 A1* | 8/2017 | Kang | .................. | F21V 5/007 362/237 |
| 2017/0357100 A1* | 12/2017 | Ouderkirk | .................. | G02B 27/281 |
| 2018/0088257 A1* | 3/2018 | Ding | .................. | G02B 27/0025 |
| 2018/0100632 A1* | 4/2018 | Kim | .................. | H01L 33/58 |
| 2018/0163933 A1* | 6/2018 | Kim | .................. | H01L 33/58 |
| 2018/0172955 A1* | 6/2018 | Bone | .................. | G02B 3/04 |
| 2018/0188483 A1* | 7/2018 | Hsieh | .................. | G02B 3/04 |
| 2019/0063695 A1* | 2/2019 | Oh | .................. | F21V 5/04 |

FOREIGN PATENT DOCUMENTS

| | | |
|---|---|---|
| KR | 10-2014-0001503 | 1/2014 |
| KR | 10-1541826 | 8/2015 |

\* cited by examiner

LENS AND LIGHTING DEVICE INCLUDING SAME

CROSS-REFERENCE TO RELATED PATENT APPLICATIONS

This application is a U.S. National Stage Application under 35 U.S.C. § 371 of PCT Application No. PCT/KR2016/011170, filed Oct. 6, 2016, which claims priority to Korean Patent Application No. 10-2015-0142708, filed Oct. 13, 2015, whose entire disclosures are hereby incorporated by reference.

TECHNICAL FIELD

Embodiments relate to a lens and a lighting device including the same, and more particularly, to a lighting device disposed inside a refrigerator or the like.

BACKGROUND ART

Group III-V compound semiconductors such as, for example, GaN and AlGaN, are widely used for optoelectronics and electronic elements owing to many advantages such as, for example, a wide and easily adjustable band gap energy.

In particular, light-emitting elements such as light-emitting diodes or laser diodes using group III-V or II-VI compound semiconductors may realize various colors of light such as, for example, red, green, and blue light, as well as ultraviolet light, via the development of element materials and thin-film growth technique, and may also realize white light having high luminous efficacy via the use of a fluorescent material or by combining colors. These light-emitting elements have advantages of low power consumption, a semi-permanent lifespan, fast response speed, good safety, and eco-friendly properties compared to existing light sources such as, for example, fluorescent lamps and incandescent lamps.

Accordingly, the application of light-emitting elements has been expanded to a transmission module of an optical communication apparatus, a light-emitting diode backlight, which may substitute for a cold cathode fluorescent lamp (CCFL) constituting a backlight of a liquid crystal display (LCD) device, a white light-emitting diode lighting device, which may substitute for a fluorescent lamp or an incandescent bulb, a vehicle headlight, and a signal lamp.

A molding member may be disposed around a light-emitting element to protect a light-emitting structure, a wire, or the like. Light is refracted when passing through the molding member, which is formed of silicon or the like. Thus, the molding member may serve as a primary lens.

However, a secondary lens may be used in order to adjust the path along which light is discharged when a light-emitting element is used as a light source of a lighting device. The aforementioned secondary lens is commonly referred to as a "lens".

An optical path may be greatly changed depending on the material of a lens and particularly on the shape thereof. In particular, in the case of a lighting device that needs to uniformly radiate light discharged from a light source at an angle within a particular range, the shape and operation of a lens is even more important.

Technical Object

Embodiments provide a lens, which uniformly discharges light at an angle within a particular range, and a lighting device including the same.

Technical Solution

One embodiment provides a lens including a light entrance surface, and a light exit surface facing the light entrance surface, wherein a product of a height rate (HR) of the light entrance surface and an HR of the light exit surface on a cross section in a first direction ranges from 1.45 to 1.66, where the HR of the light entrance surface is h0/h1, "h0" denotes a distance from a reference line to the light entrance surface corresponding to a center axis, and "h1" denotes a height from the reference line to a midpoint of a straight line, which interconnects regions P11 and P12 on the light entrance surface that correspond to points at one-third and two-thirds of a distance from one end of the reference line to the center axis, respectively, and where the HR of the light exit surface is h3/h2, "h3" denotes a distance from the reference line to the light exit surface corresponding to the center axis, and "h2" denotes a height from the reference line to a midpoint of a straight line, which interconnects regions P21 and P22 on the light exit surface that correspond to points at one-third and two-thirds of the distance from the one end of the reference line to the center axis, respectively.

A product of a tangential rate (TR) of the light entrance surface and a TR of the light exit surface on the cross section in the first direction may range from 0.75 to 0.96, where the TR of the light entrance surface is $\theta 0/\theta 1$, "$\theta 0$" denotes an angle between the reference line and a straight line, which connects the one end of the reference line to a region of the light entrance surface corresponding to the center axis, and "$\theta 1$" denotes an angle between the reference line and the straight line, which interconnects the regions P11 and P12 on the light entrance surface that correspond to the points at one-third and two-thirds of the distance from the one end of the reference line to the center axis, respectively, and where the TR of the light exit surface is $\theta 3/\theta 2$, "$\theta 3$" denotes an angle between the reference line and a straight line, which connects one end of the light exit surface to a region of the light exit surface corresponding to the center axis, and "$\theta 2$" denotes an angle between the reference line and the straight line, which interconnects the regions P21 and P22 on the light exit surface that correspond to the points at one-third and two-thirds of the distance from the one end of the reference line to the center axis, respectively.

Another embodiment provides a lens including a light entrance surface and a light exit surface facing the light entrance surface, wherein a product of a tangential rate (TR) of the light entrance surface and a TR of the light exit surface on a cross section in a first direction ranges from 0.75 to 0.96, where the TR of the light entrance surface is $\theta 0/\theta 1$, "$\theta 0$" denotes an angle between a reference line and a straight line, which connects one end of the reference line to a region of the light entrance surface corresponding to a center axis, and "$\theta 1$" denotes an angle between the reference line and the straight line, which interconnects regions P11 and P12 on the light entrance surface that correspond to points at one-third and two-thirds of a distance from the one end of the reference line to the center axis, respectively, and where the TR of the light exit surface is $\theta 3/\theta 2$, "$\theta 3$" denotes an angle between the reference line and a straight line, which connects one end of the light exit surface to a region of the light exit surface corresponding to the center axis, and "$\theta 2$"

denotes an angle between the reference line and a straight line, which interconnects regions P21 and P22 on the light exit surface that correspond to the points at one-third and two-thirds of the distance from the one end of the reference line to the center axis, respectively.

A product of a height rate (HR) of the light entrance surface and an HR of the light exit surface on the cross section in the first direction may range from 1.45 to 1.66, where the HR of the light entrance surface is h0/h1, "h0" denotes a distance from the reference line to the light entrance surface corresponding to the center axis, and "h1" denotes a height from the reference line to a midpoint of the straight line, which interconnects the regions P11 and P12 on the light entrance surface that correspond to the points at one-third and two-thirds of the distance from the one end of the reference line to the center axis, respectively, and where the HR of the light exit surface is h3/h2, "h3" denotes a distance from the reference line to the light exit surface corresponding to the center axis, and "h2" denotes a height from the reference line to a midpoint of the straight line, which interconnects the regions P21 and P22 on the light exit surface that correspond to the points at one-third and two-thirds of the distance from the one end of the reference line to the center axis, respectively.

The light entrance surface and the light exit surface may be symmetrical to each other relative to the center axis.

At least one of the light entrance surface and the light exit surface may have a consistent shape in a predetermined section in a second direction crossing the first direction.

The light entrance surface or the light exit surface may be an aspherical surface or a spherical surface.

The light entrance surface may vary in curvature at the regions P11 and P12.

The light exit surface may vary in curvature at the regions P21 and P22.

Regions of the light entrance surface and the light exit surface adjacent to the regions P12 and P22 may respectively be disposed farthest from the reference line.

The light exit surface may include a recess formed in a central region.

The lens may have an uneven thickness in a direction perpendicular to the reference line.

A further embodiment provides a lighting device including a body including a bottom surface and a sidewall, a light source module disposed on the bottom surface and including a circuit board and a light-emitting element, and a lens disposed on the sidewall according to claim 1 or 3.

The light entrance surface of the lens may come into contact with the sidewall at opposite ends thereof in the first direction.

Advantageous Effects

A lighting device having a lens according to the embodiments exerts uniform luminosity within a range from 80 degrees to 90 degrees in a first direction and creates consistent light distribution in a second direction. As such, the lighting device may be used as a uniform light source having a line shape when it is disposed inside a refrigerator, or the like.

DESCRIPTION OF DRAWINGS

FIG. 2b is a cross-sectional view taken along line I-I' of FIG. 2a.

FIG. 2c is a plan view of a lens of FIG. 2a.

BEST MODE

Hereinafter, embodiments will be described in detail with reference to the accompanying drawings, in order to concretely realize the object described above.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

Figure 1:
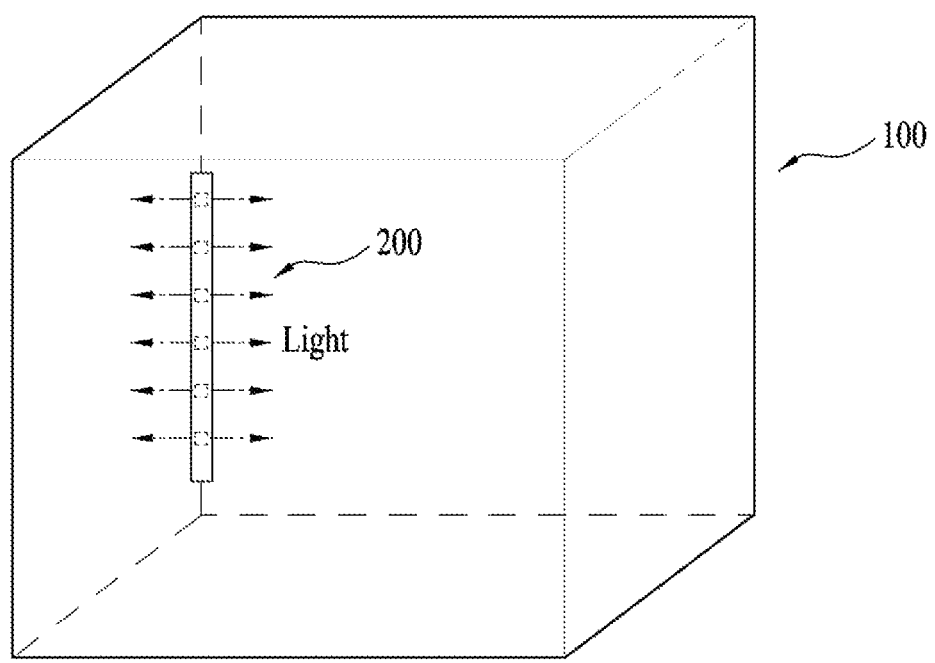
FIG. 1 is a view illustrating a lighting device disposed in a refrigerator.

FIG. 1 is a view illustrating a lighting device disposed in a refrigerator.

A lighting device 200 may be disposed inside a refrigerator 100. The lighting device 200 may be disposed in a corner inside a refrigerator, and may be disposed in the vertical direction, as illustrated.

The above-described lighting device 200 and the adjacent refrigerator body may form an angle within a range from 80 degrees to 100 degrees, and thus most of the light discharged from the lighting device 200 may also need to be radiated within an angular range of 90 degrees. Specifically, the light discharged from the lighting device 200 may have light distribution within a range from 80 degrees to 90 degrees, and the distribution of luminosity needs to be substantially constant within the above-described angular range.

Figure 2A:
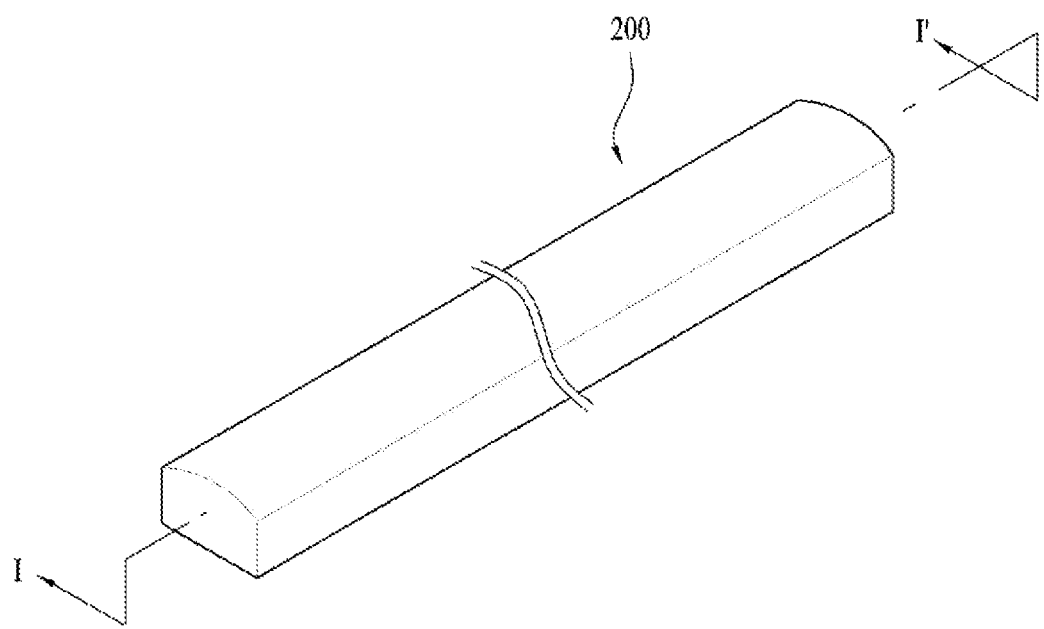
FIG. 2a is a perspective view of an embodiment of the lighting device illustrated in FIG. 1.
Figure 2B:
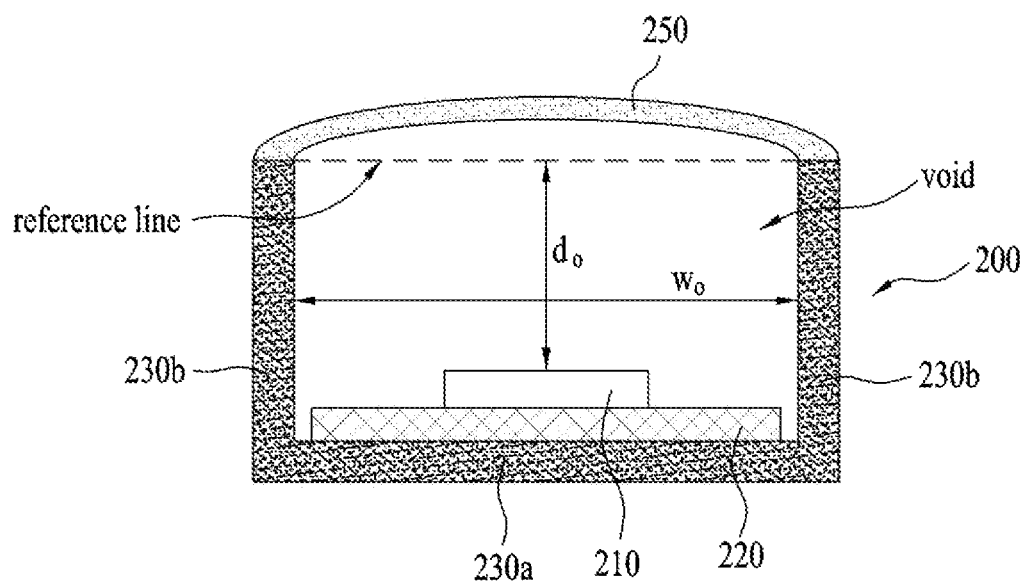
Figure 2C:
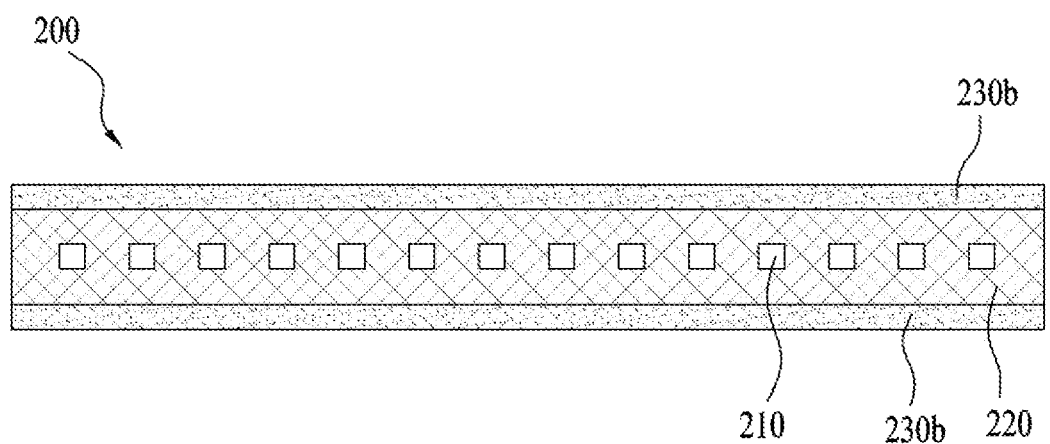

FIG. 2a is a perspective view of an embodiment of the lighting device illustrated in FIG. 1, FIG. 2b is a cross-sectional view taken along line I-I' of FIG. 2a, and FIG. 2c is a plan view of a lens of FIG. 2a.

Assuming the left-and-right direction of FIG. 2b is referred to as a "first direction", the lighting device 200 may have a shape that crosses the first direction and is elongated in a second direction, which is the vertical direction or close to the vertical direction.

In FIG. 2a, direction I-I' may be the second direction, and the lighting device 200 may have a consistent shape in a predetermined section in the second direction.

As illustrated in FIG. 2b, the body of the lighting device 200 includes a bottom surface 230a and a sidewall 230b, and a lens 250 is disposed to cover the top of the sidewall 230b.

A light source module may be disposed on the bottom surface 230a of the body. The light source module may include a circuit board 220 and a light-emitting element 210 on the circuit board 220. The circuit board 220 may be a printed circuit board, a flexible circuit board, or the like.

The lens 250 may be configured such that a light entrance surface S1, which will be described below, comes into contact at opposite ends thereof in the first direction with the sidewall 230b.

A void may be formed in the space inside the lighting device 200, which is surrounded by the bottom surface 230a, the sidewall 230b, and the lens 250. The width W0 of the aforementioned space may be greater than the distance d0 from the light-emitting element 210 to a reference line. That is, the aforementioned void may be elongated further in the horizontal direction than in the vertical direction.

In order to form a lighting device having a thin shape, the thickness of the lens 250 may be equal to or less than 2 mm. Here, the "thickness" of the lens may be "h3" in FIG. 3d.

The shape of the lens 250 will be described below with reference to FIGS. 3a to 3d.

Figure 2D:
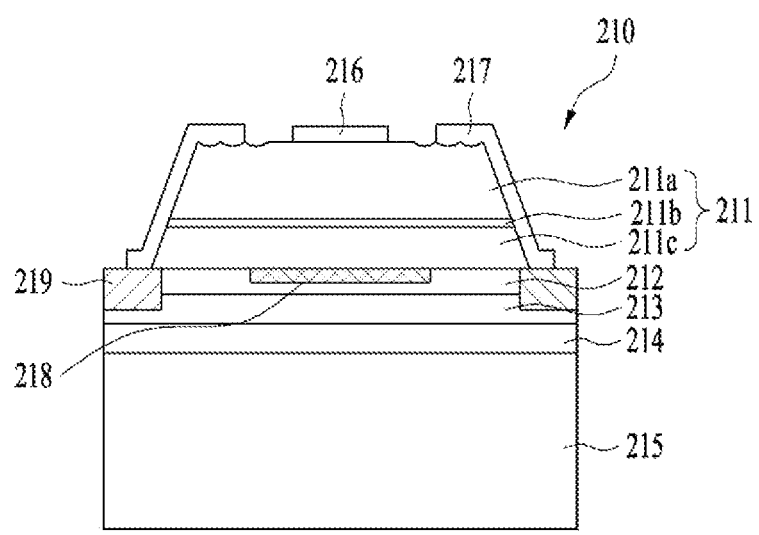
FIG. 2d is a view illustrating an embodiment of a light-emitting element of FIG. 2b.

FIG. 2d is a view illustrating an embodiment of the light-emitting element of FIG. 2b.

The light-emitting element 210 may be a light-emitting diode, and for example, may be a vertical-type light-emitting element, a horizontal-type light-emitting element, or a flip-chip-type light-emitting element. FIG. 2d illustrates a vertical-type light-emitting element by way of example.

In the light-emitting element 210, a bonding layer 214, a reflective layer 213, and an ohmic layer 212 may be disposed on a support substrate 215, a light-emitting structure 211 may be disposed on the ohmic layer 212, and a channel layer 219 may be disposed in an edge area beneath the light-emitting structure.

The support substrate 215 may be a base substrate, and may be formed of at least one selected from among copper (Cu), gold (Au), nickel (Ni), molybdenum (Mo), and copper-tungsten (Cu—W). In addition, the support substrate 215 may configured as a carrier wafer using, for example, Si, Ge, GaAs, ZnO, SiC, SiGe, $Ga_2O_3$, or GaN.

The bonding layer 214 may be disposed on the support substrate 215. The bonding layer 214 may bond the reflective layer 213 to the support substrate 215. The bonding layer 214 may include, for example, at least one of Ti, Au, Sn, Ni, Cr, Ga, In, Bi, Cu, Ag, and Ta, and may be disposed in a single layer or in multiple layers.

The reflective layer 213 may be disposed on the bonding layer 214. The reflective layer 213 may be formed in a single layer or in multiple layers using any one selected from among materials having excellent reflection characteristics, for example, silver (Ag), nickel (Ni), aluminum (Al), rubidium (Rh), palladium (Pd), iridium (Ir), ruthenium (Ru), magnesium (Mg), zinc (An), platinum (Pt), gold (Au), hafnium (Hf), and selective combinations thereof, or using the metal material and a light-transmitting conductive material such as, for example, IZO, IZTO, IAZO, IGZO, IGTO, AZO, or ATO. In addition, the reflective layer 213 may be, for example, the stack of IZO/Ni, AZO/Ag, IZO/Ag/Ni, or AZO/Ag/Ni, without being limited thereto.

The ohmic layer 212 may be formed on the reflective layer 213. The ohmic layer 212 may be in ohmic contact with the lower surface of the light-emitting structure, and may be configured as a layer or a plurality of patterns.

The ohmic layer 212 may selectively use a light-transmitting electrode layer and a metal, and may be formed in a single layer or in multiple layers using one or more selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

The support substrate 215, the bonding layer 214, the reflective layer 213, and the reflective layer 212 may form a second electrode, and may supply current to the light-emitting structure.

The channel layer 219 may be disposed between the second electrode and the edge of the light-emitting structure 211. The channel layer 219 may be disposed in the edge area beneath the light-emitting structure, and may be formed of a light-transmitting material such as, for example, a metal oxide, a metal nitride, a light-transmitting nitride, or a light-transmitting oxide, may be formed as a light-transmitting insulation layer.

For example, the channel layer 219 may be formed using one selected from among indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$ and $TiO_2$.

The light-emitting structure 211 may be disposed on the ohmic layer 212. The light-emitting structure 211 includes a first conductive semiconductor layer 211a, an active layer 211b, and a second conductive semiconductor layer 211c.

The first conductive semiconductor layer 211a may be formed using, for example, group III-V or II-VI compound semiconductors, and may be doped with a first conductive dopant. The first conductive semiconductor layer 211a may be formed of a semiconductor material having a composition equation of $Al_xIn_yGa_{1-x-y}N$ ($0 \le x \le 1$, $0 \le y \le 1$, $0 \le x+y \le 1$), for example, any one or more selected from among AlGaN, GaN, InAlGaN, AlGaAs, GaP, GaAs, GaAsP, and AlGaInP.

When the first conductive semiconductor layer 211a is an n-type semiconductor layer, the first conductive dopant may include an n-type dopant such as, for example, Si, Ge, Sn, Se, or Te. The first conductive semiconductor layer 211a may be formed in a single layer or in multiple layers, without being limited thereto.

The active layer 211b may be disposed between the first conductive semiconductor layer 211a and the second conductive semiconductor layer 211c, and may include any one of a single well structure, a multi-well structure, a single quantum well structure, a multi quantum well (MOW) structure, a quantum dot structure, and a quantum line structure.

The active layer 211b may have any one or more pair structures of a well layer and a barrier layer using group III-V compound semiconductors, for example, AlGaN/AlGaN, InGaN/GaN, InGaN/InGaN, AlGaN/GaN, InAlGaN/GaN, GaAs(InGaAs)/AlGaAs, and GaP(InGaP)/AlGaP, without being limited thereto.

The well layer may be formed of a material that has a smaller energy band gap than the energy band gap of the barrier layer.

The second conductive semiconductor layer 211c may be formed using compound semiconductors. The second conductive semiconductor layer 211c may be formed of, for example, group III-V or II-VI compound semiconductors, and may be doped with a second conductive dopant. The second conductive semiconductor layer 211c may be formed of a semiconductor material having a composition equation of $In_xAl_yGa_{1-x-y}N$ ($0 \le x \le 1$, $0 \le y \le 1$, $0 \le x+y \le 1$), for example, any one or more selected from among AlGaN, GaNAlInN, AlGaAs, GaP, GaAs, GaAsP, and AlGaInP.

When the second conductive semiconductor layer 211c is a p-type semiconductor layer, the second conductive dopant may be a p-type dopant such as, for example, Mg, Zn, Ca, Sr or Ba. The second conductive semiconductor layer 211c may be formed in a single layer or in multiple layers, without being limited thereto.

Although not illustrated, an electron blocking layer may be disposed between the active layer 211b and the second conductive semiconductor layer 211c. The electron blocking layer may have the structure of a super-lattice. For example, the super-lattice may be formed by disposing AlGaN doped with a second conductive dopant and alternately disposing a plurality of GaN layers having different composition rates of aluminum, without being limited thereto.

The surface of the first conductive semiconductor layer 211a may have, for example, an uneven pattern in order to increase light extraction efficiency. A first electrode 216 is disposed on the surface of the first conductive semiconductor layer 211a. As illustrated, the surface of the first conductive semiconductor layer 211a, on which the first electrode 216 is disposed, may be patterned in the same manner as the surface of the first conductive semiconductor layer 211a, or may not be patterned. The first electrode 216 may be formed in a single layer or in multiple layers using at least one selected from among aluminum (Al), titanium (Ti), chrome (Cr), nickel (Ni), copper (Cu), gold (Au), rhodium (Rh), tungsten (W), and platinum (Pt).

A current blocking layer 218 may be disposed beneath the light-emitting structure 211 so as to correspond to the first electrode 216. The current blocking layer may be formed using an insulating material. The current blocking layer may cause the current supplied from the direction of the support substrate 215 to be uniformly supplied to the entire area of the second conductive semiconductor layer 211c. The current blocking layer 218 may be disposed in the area in which it vertically overlaps the first electrode 216, without being limited thereto.

A passivation layer 217 may be formed around the light-emitting structure 211. The passivation layer 217 may be formed of an insulating material, and the insulating material may include a non-conductive oxide or nitride. In one example, the passivation layer 217 may be configured as a silicon oxide ($SiO_2$) layer, a nitride oxide layer, or an aluminum oxide layer.

Figure 3A:
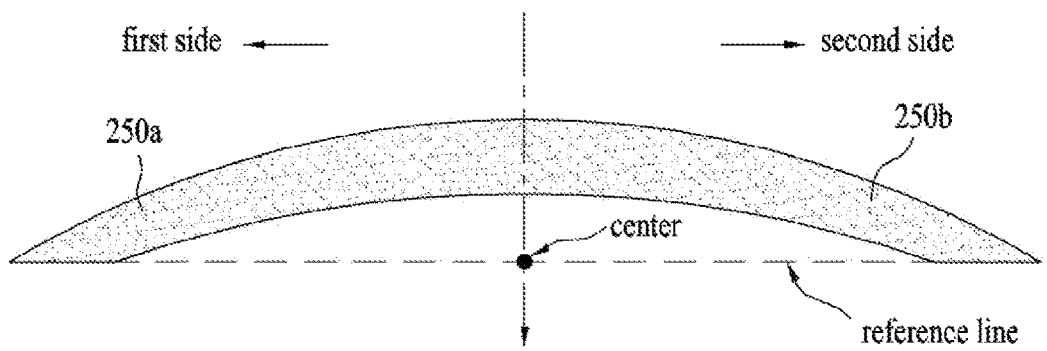
FIG. 3a is a view illustrating the lens of FIG. 2a in detail.

FIG. 3a is a view illustrating the lens of FIG. 2a in detail.

The cross section of the lens 250 in the above-described first direction is illustrated. A first portion 250a and a second portion 250b may be formed symmetrical to the first side and the second side on the basis of the center axis. In addition, the thickness of the lens 250 in the vertical direction may be different in respective regions of the lens 250. For example, the lens 250 may have the greatest thickness in the region thereof corresponding to the center axis, without being limited thereto. Here, the "vertical direction" refers to the direction that is perpendicular to the reference line.

In addition, the reference line may be parallel to a light-emitting surface of the above-described light-emitting element 210, and may also be an imaginary line that interconnects the top surfaces of a pair of sidewalls 230b of the body.

Figure 3B:
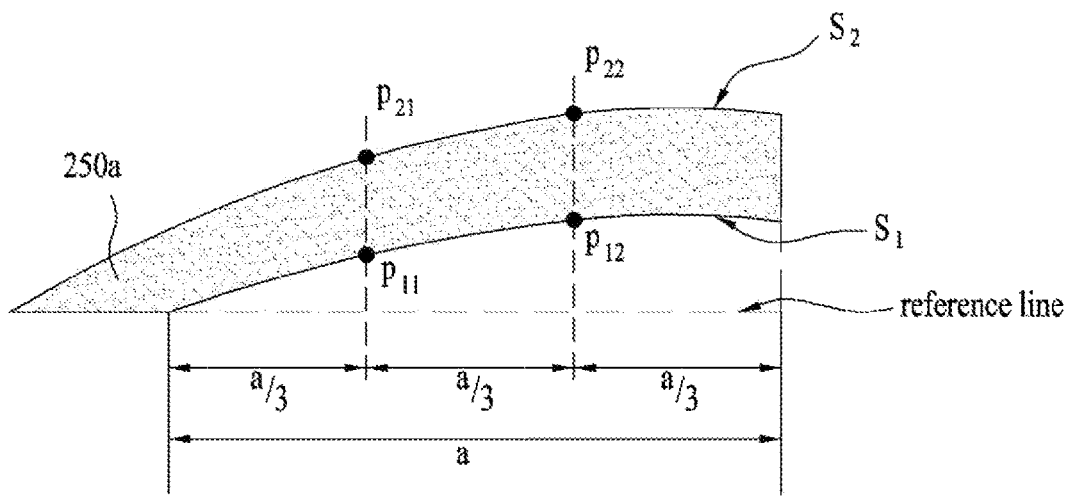
FIGS. 3b to 3d are views illustrating a first side of FIG. 3a in detail.
Figure 3C:
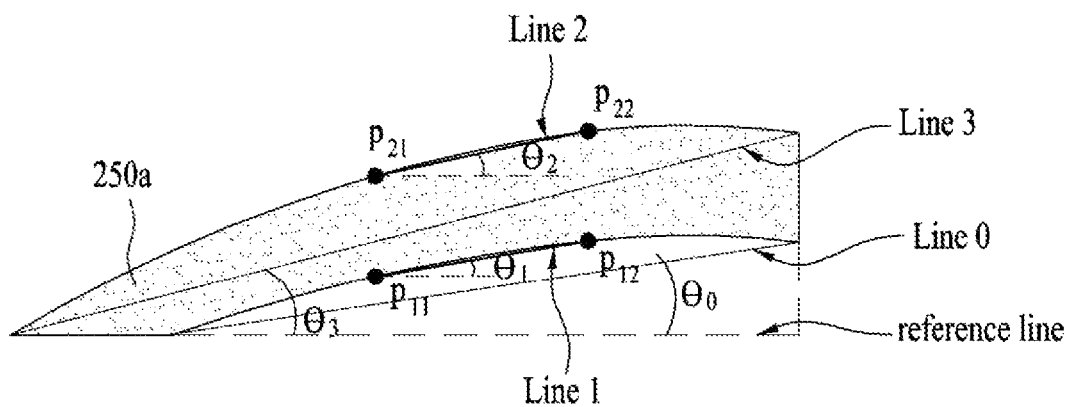
Figure 3D:
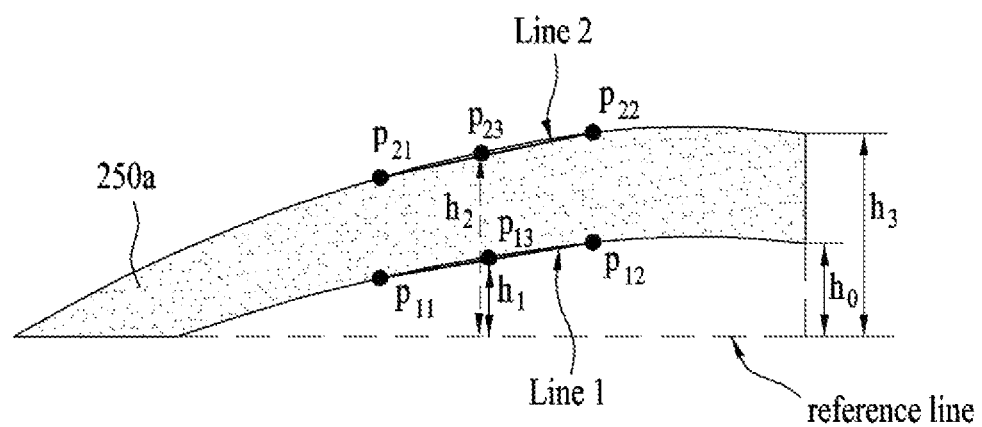
Figure 4A:
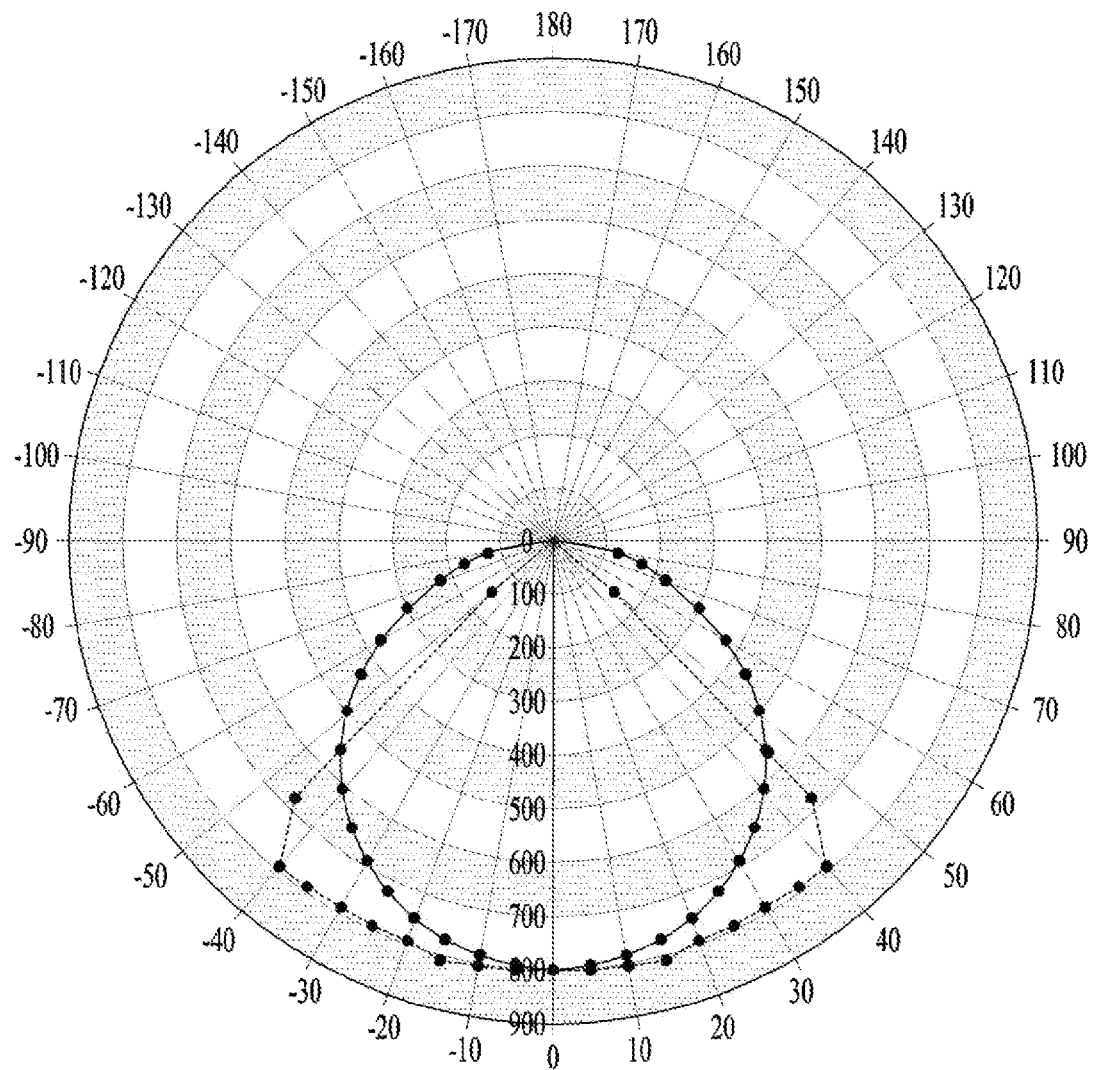
FIGS. 4a to 4f illustrate the distribution of light discharged from a lighting device having a lens disposed therein according to Examples 1 to 6.
Figure 4B:
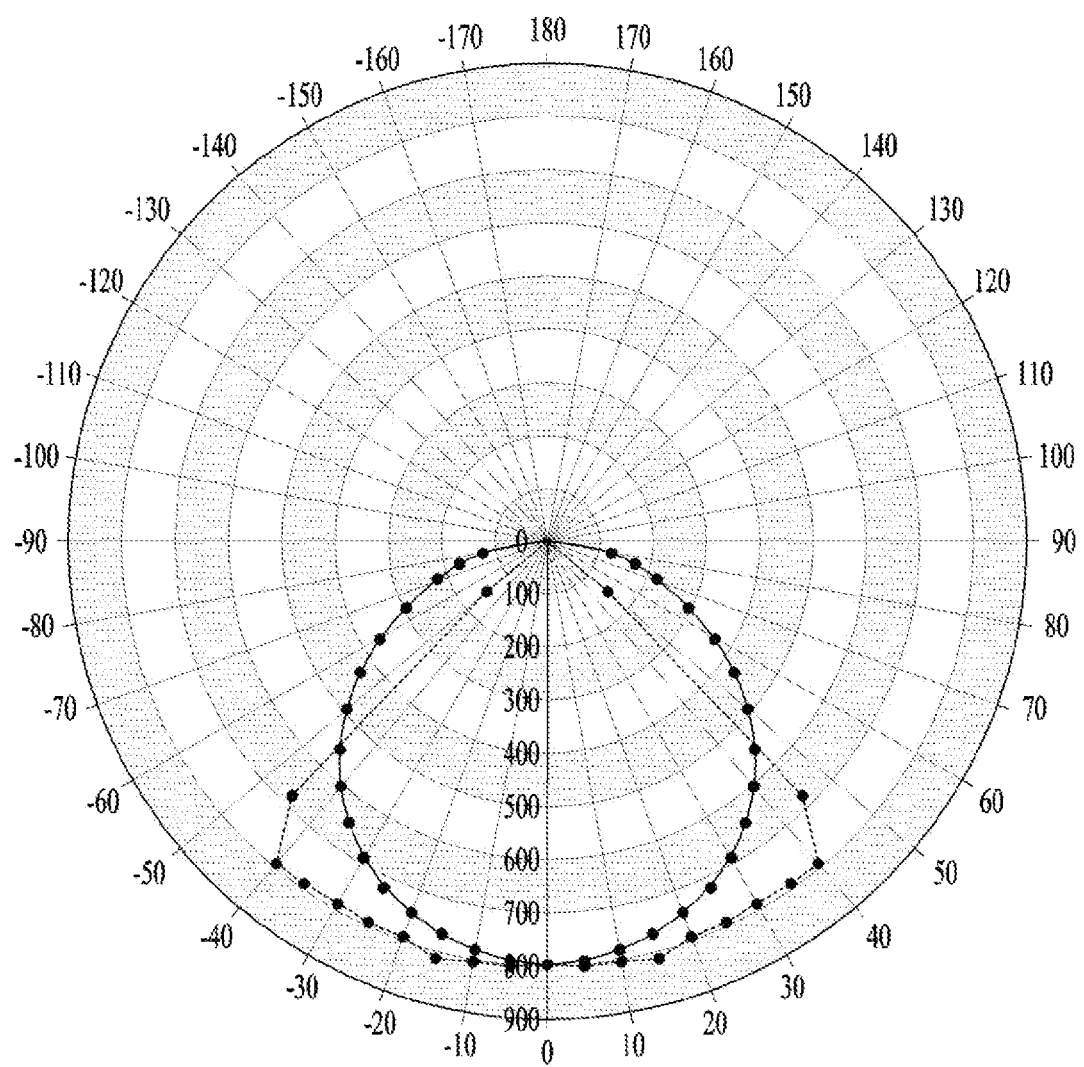
Figure 4C:
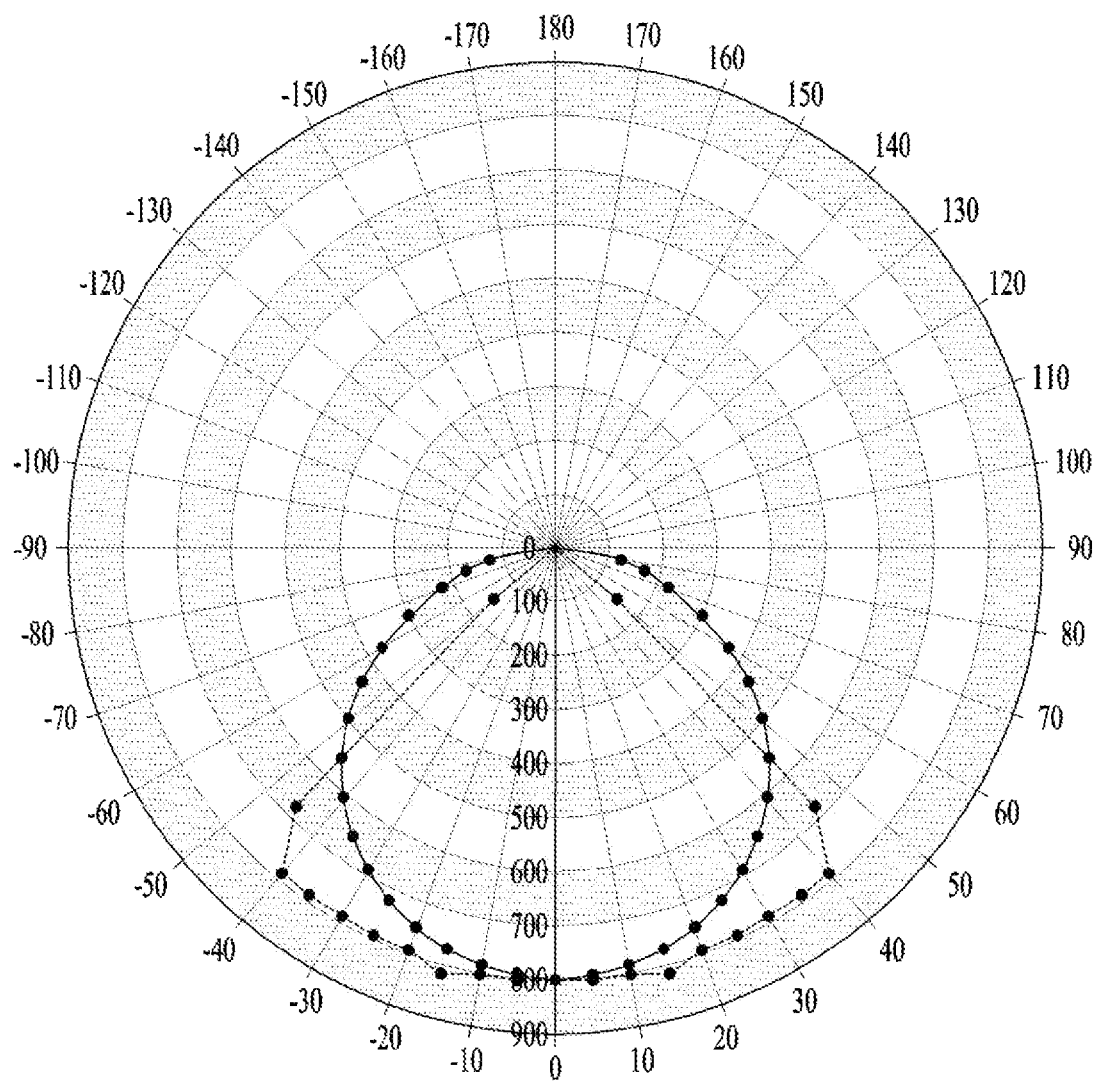
Figure 4D:
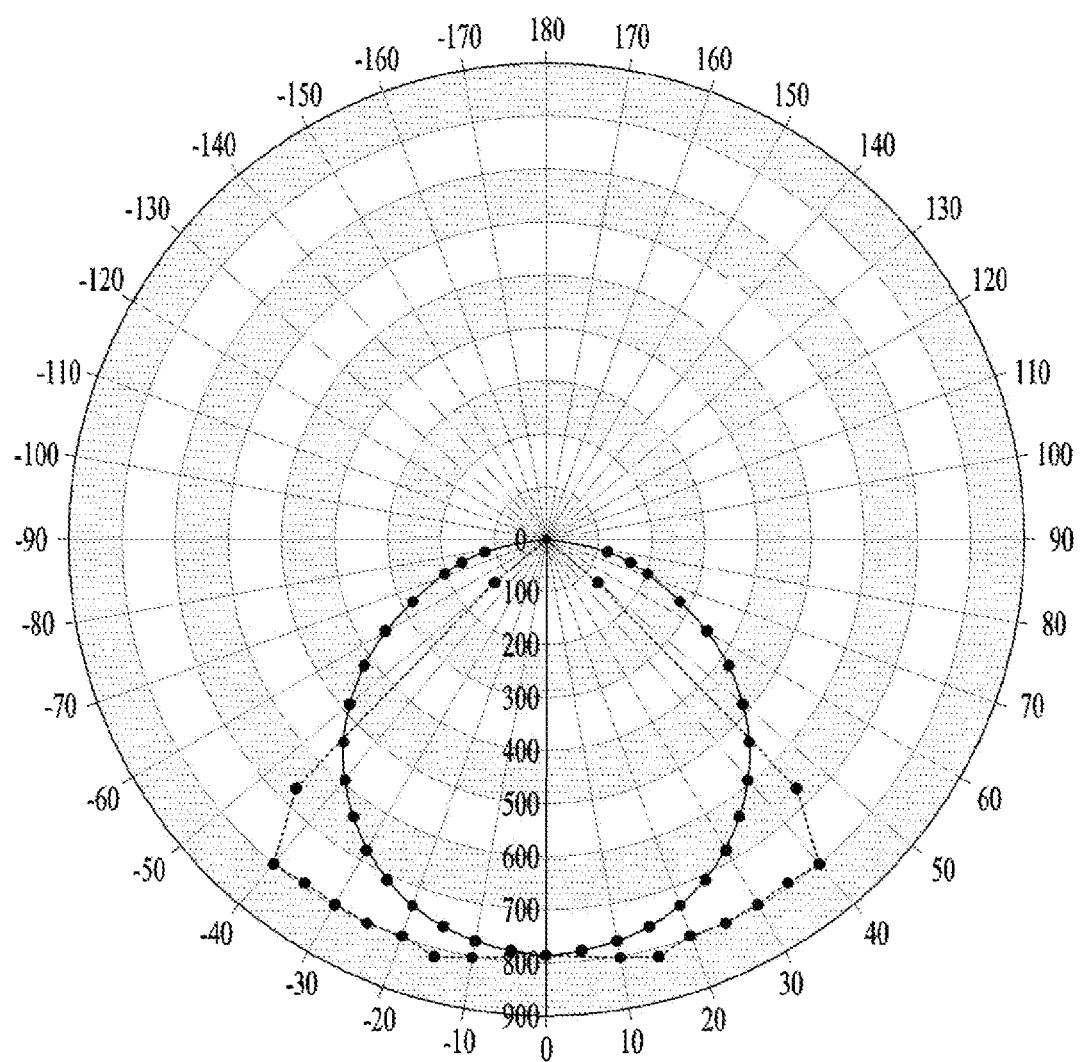
Figure 4E:
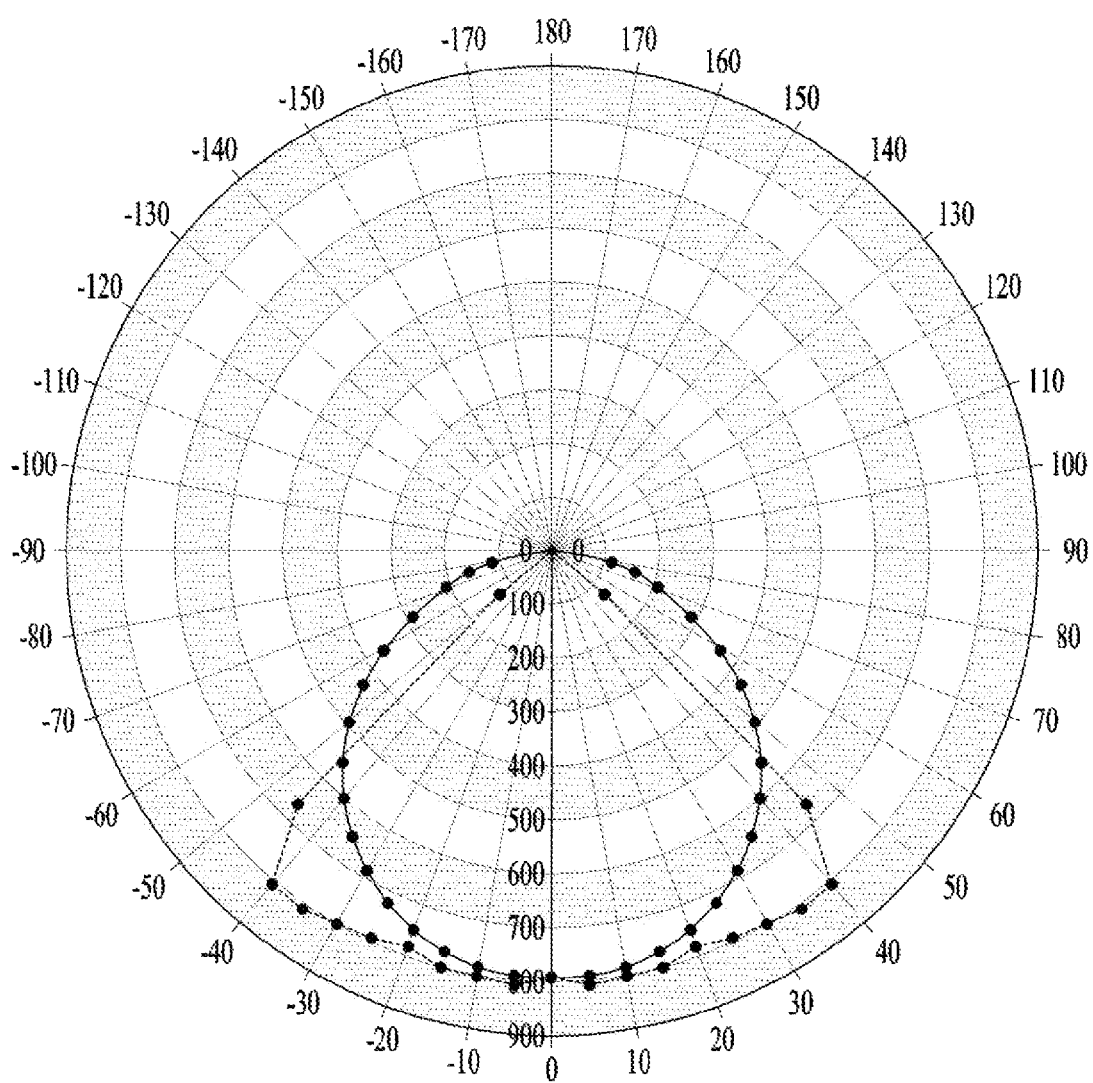
Figure 4F:
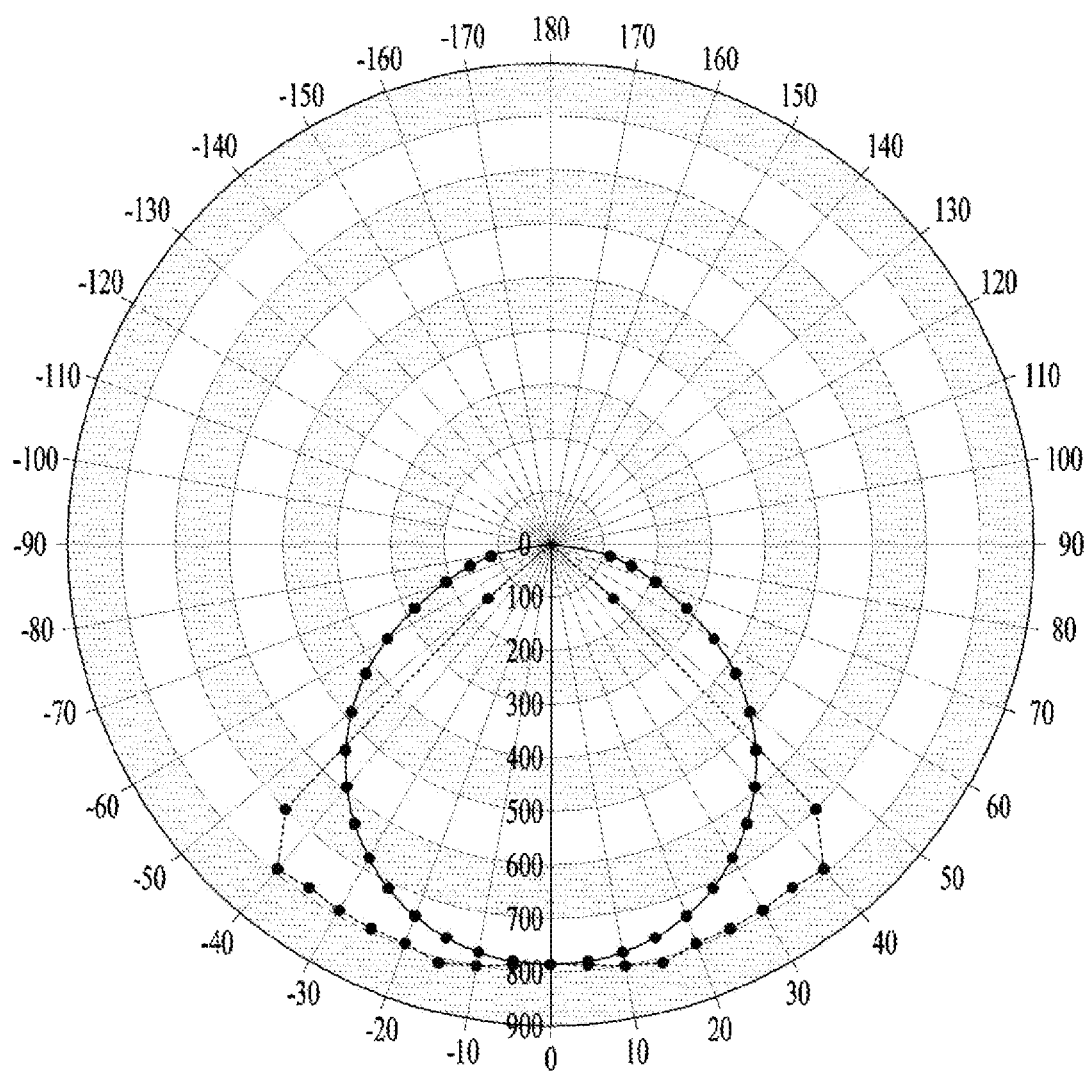

FIGS. 3b to 3d are views illustrating the first side of FIG. 3a in detail.

As illustrated in FIG. 3a, the lens 250 may include the first portion 250a and the second portion 250b, which are symmetrical to each other, and may be formed of any of various materials, for example, polycarbonate. With reference to FIGS. 3b to 3d, the shape of only the first portion 250a will be described.

In FIG. 3b, a light entrance surface S1 and a light exit surface S2 of the first portion 250a of the lens are illustrated. The light entrance surface S1 may be the area on which light discharged from the above-described light-emitting element 210 is incident, and the light exit surface S2 may be the area that faces the light entrance surface S1 and from which the above-described light is discharged outward.

In FIG. 3b, when dividing the distance a from one end of the reference line that meets the first portion 250a of the lens to the center axis into three, regions on the light entrance surface S1 corresponding respectively to a one-third point and a two-thirds point of the distance a may be designated by "P11" and "P12", and regions on the light exit surface S2 corresponding respectively to a one-third point and a two-thirds point of the distance a may be designated by "P21" and "P22". Here, "corresponding" regions are regions corresponding to the points in the direction perpendicular to the reference line.

The curvature of the lens may vary at the above-described regions P11 and P12 and at the above-described regions P21 and P22. Each of the light entrance surface and the light exit surface of the lens may be curved, and specifically, may be aspherical surfaces or spherical surfaces.

In addition, the curvatures of the light entrance surface S1 at respective points and the curvatures of the light exit surface S2 at points corresponding thereto in the direction perpendicular to the light entrance surface S1 may be the same, without being limited thereto.

In FIG. 3c, four straight lines, i.e. Line 0 to Line 3, are illustrated.

Line O may designate a straight line that connects the point at which one end of the reference line meets the first portion 250a of the lens, to a portion of the light entrance surface S1 corresponding to the center axis.

Line 1 may designate a straight line that interconnects the above-described regions P11 and P12.

Line 2 may designate a straight line that interconnects the above-described regions P21 and P22.

Line 3 may designate a straight line that connects one end of the light exit surface S2 to a region of the light exit surface S2 corresponding to the center axis. Here, the one end of the light exit surface S2 may be the region of the light exit surface S2 that meets an extension of the reference line.

In FIG. 3c, "θ0" may be an angle between the reference line and Line 0, "θ1" may be an angle between the reference line and Line 1, "θ2" may be an angle between the reference line and Line 2, and "θ3" may be an angle between the reference line and Line 3.

In FIG. 3d, four heights, i.e. h0 to h3, are illustrated.

"h0" may denote the distance from the reference line to the light entrance surface S1 corresponding to the center axis.

"h1" may denote the distance from the reference line to a midpoint P13 of Line 1.

"h2" may denote the distance from the reference line to a midpoint P23 of Line 2.

"h3" may denote the distance from the reference line to the light exit surface S2 corresponding to the center axis.

In addition, in FIGS. 3b to 3d, the light entrance surface S1 and the light exit surface S2 may respectively have the highest height in regions thereof adjacent to the regions P12 and P22, without being limited thereto. The light exit surface S2 may have the greatest height in the region corresponding to the center axis.

As illustrated in FIGS. 3b to 3d, when the light entrance surface S1 and the light exit surface S2 respectively have the highest height in regions thereof adjacent to the regions P12 and P22, the entire lens 250 may be shaped such that a central region of the light exit surface S2 is recessed to form a recess.

In the lens 250 described above, "h0/h1" may denote the height rate (HR) of the light entrance surface, and "h3/h2" may denote the HR of the light exit surface. In addition, "θ0/θ1" may denote the tangential rate (TR) of the light entrance surface, and "θ3/θ2" may denote the TR of the light exit surface.

Table 1 shows the characteristics of a lens according to Examples 1 to 6. FIGS. 4a to 4f illustrate the distribution of light discharged from a lighting device having a lens disposed therein according to Examples 1 to 6.

TABLE 1

|    |       | Example 1 | Example 2 | Example 3 | Example 4 | Example 5 | Example 6 |
|----|-------|-----------|-----------|-----------|-----------|-----------|-----------|
| S1 | h1    | 0.41      | 0.425     | 0.429     | 0.384     | 0.4       | 0.41      |
|    | HR1   | 1.2195    | 1.176471  | 1.165501  | 1.302083  | 1.25      | 1.219512  |
|    | θ1    | 3.4       | 3.3       | 3.3       | 3.2       | 3.6       | 3.01      |
|    | TR1   | 0.8026    | 0.827237  | 0.827237  | 0.85315   | 0.758333  | 0.906977  |
| S2 | h2    | 1.57      | 1.6       | 1.6       | 1.57      | 1.57      | 1.6       |
|    | HR2   | 1.2739    | 1.25      | 1.25      | 1.274084  | 1.274084  | 1.250183  |
|    | θ2    | 9         | 9.0       | 9.0       | 9.0       | 9.1       | 8.6       |
|    | TR2   | 1.0102    | 1.010169  | 1.010169  | 1.010169  | 0.998882  | 1.057918  |
| Product of HR | | 1.5535187 | 1.470803 | 1.45709 | 1.658964 | 1.592605 | 1.524613 |
| Product of TR | | 0.8107676 | 0.835685 | 0.835685 | 0.8618 | 0.757486 | 0.959507 |
| BA |        | 95.297    | 95.338    | 95.374    | 95.090    | 95.049    | 95.591    |
| FA |        | 107.40    | 107.61    | 107.71    | 106.73    | 106.74    | 107.60    |
| CD(20/0) |  | 0.99671   | 0.99802   | 0.99458   | 1.0194    | 0.98368   | 1.0196    |
| CD(40/0) |  | 0.99114   | 0.98742   | 0.98058   | 1.0197    | 1.0183    | 1.0012    |

In Examples 1 to 6, the product of the HR of the light entrance surface S1 and the HR of the light exit surface S2 may be greater than 1.45 and less than 1.66, and the product of the TR of the light entrance surface S1 and the TR of the light exit surface S2 may be greater than 0.75 and less than 0.96.

In addition, in Examples 1 to 6, the beam angle (BA) may be greater than 90 degrees and less than 100 degrees, and the field angle (FA) may be greater than 100 degrees and less than 110 degrees.

Light discharged from a light-emitting element or a light-emitting element package may have various luminosity distributions depending on the angle thereof. The beam angle indicates the range of distribution of light having half or more of the maximum luminosity, and the field angle indicates the range of distribution of light having one tenth of the maximum luminosity. Here, "luminosity" indicates the intensity of light measured at a distance from a light source, and specifically, indicates the amount of light that passes through a fixed region perpendicular to the radiation direction of light at a location spaced a fixed distance apart from a light source during a fixed time, and the unit thereof is candela (cd).

In addition, "CD(20/0)" refers to the luminosity measured at a region angularly spaced apart from the top surface of the light-emitting element by an angle of 20 degrees relative to the luminosity measured at the top surface of the light-emitting element, and "CD(40/0)" refers to the luminosity measured at a region angularly spaced apart from the top surface of the light-emitting element by an angle of 40 degrees relative to the luminosity measured at the top surface of the light-emitting element.

That the CD(20/0) is closer to 1 means that the luminosity measured at the region angularly spaced apart from the top surface of the light-emitting element by an angle of 20 degrees becomes equal to the luminosity measured at the top surface of the light-emitting element. In addition, that the CD(40/0) is closer to 1 means that the luminosity measured at the region angularly spaced apart from the top surface of the light-emitting element by an angle of 40 degrees becomes equal to the luminosity measured at the top surface of the light-emitting element.

In Examples 1 to 6, the CD(20/0) and the CD(40/0) may respectively be greater than 98% and less than 102%.

That is, as described above, in Examples 1 to 6, when the product of the HR of the light entrance surface S1 and the HR of the light exit surface S2 is greater than 1.45 and less than 1.66 and the product of the TR of the light entrance surface S1 and the TR of the light exit surface S2 is greater than 0.75 and less than 0.96, the beam angle (BA) may be greater than 90 degrees and less than 100 degrees, the field angle (FA) may be greater than 100 degrees and less than 110 degrees, and the CD(20/0) and CD(40/0) may respectively be greater than 0.98 and less than 1.02.

When the product of the HR of the light entrance surface S1 and the HR of the light exit surface S2 is equal to or less than 1.45, the distribution of the light discharged from the lens may not be uniform. As in Comparative Example 1, which will be described below, the luminosity measured at the region angularly spaced apart from the top surface of the light-emitting element by an angle of 40 degrees may be equal to or less than 98% of the luminosity measured at the top surface of the light-emitting element.

When the product of the HR of the light entrance surface S1 and the HR of the light exit surface S2 is equal to or greater than 1.66, the distribution of the light discharged from the lens may not be uniform. As in Comparative Example 2, which will be described below, the luminosities measured at the regions angularly spaced apart from the top surface of the light-emitting element by angles of 20 degrees and 40 degrees may be equal to or greater than 102% of the luminosity measured at the top surface of the light-emitting element.

When the product of the TR of the light entrance surface S1 and the TR of the light exit surface S2 is equal to or less than 0.75, as in Comparative Example 3, the luminosity measured at the region angularly spaced apart from the top surface of the light-emitting element by an angle of 40 degrees may be equal to or greater than 102% of the luminosity measured at the top surface of the light-emitting element, which may result in uneven light distribution.

When the product of the TR of the light entrance surface S1 and the TR of the light exit surface S2 is equal to or greater than 0.96, as in Comparative Example 6, the luminosity measured at the region angularly spaced apart from the top surface of the light-emitting element by an angle of 20 degrees may be equal to or greater than 102% of the luminosity measured at the top surface of the light-emitting element, which may result in uneven light distribution.

In FIGS. 4a to 4f, the light distribution illustrated in green shows the measured distribution of light discharged from the lighting device having the lens disposed therein according to Examples 1 to 6 illustrated in Table 1, and the light distribution illustrated in blue shows the measured distribution of light in the direction perpendicular to the measurement direction in Table 1, i.e. in the above-described second direction.

Table 2 illustrates the characteristics of a lens according to Comparative Examples 1 to 6, and FIGS. 5a to 5f illustrate the distribution of light discharged from a lighting device having a lens disposed therein according to Comparative Examples 1 to 6.

TABLE 2

|  |  | Comparative Example 1 | Comparative Example 2 | Comparative Example 3 | Comparative Example 4 | Comparative Example 5 | Comparative Example 6 |
|---|---|---|---|---|---|---|---|
| S1 | h1 | 0.432 | 0.383 | 0.4 | 0.4 | 0.41 | 0.41 |
|  | HR1 | 1.157407 | 1.305483 | 1.25 | 1.25 | 1.219512 | 1.219512 |
|  | θ1 | 3.3 | 3.2 | 3.7 | 3.6 | 3 | 3.01 |
|  | TR1 | 0.827237 | 0.85315 | 0.737838 | 0.758333 | 0.91 | 0.906977 |
| S2 | h2 | 1.6 | 1.57 | 1.57 | 1.57 | 1.6 | 1.6 |
|  | HR2 | 1.25 | 1.274084 | 1.274084 | 1.274084 | 1.250183 | 1.250183 |
|  | θ2 | 9.0 | 9.0 | 9.1 | 9.2 | 8.6 | 8.55 |
|  | TR2 | 1.010169 | 1.010169 | 0.998882 | 0.987839 | 1.057918 | 1.064198 |
| Product of HR |  | 1.446971 | 1.663295 | 1.592605 | 1.592605 | 1.524613 | 1.524613 |
| Product of TR |  | 0.835685 | 0.8618 | 0.737013 | 0.749111 | 0.962705 | 0.965203 |
| BA |  | 95.393 | 95.079 | 95.018 | 95.038 | 95.595 | 95.598 |
| FA |  | 107.80 | 106.67 | 106.57 | 106.83 | 107.61 | 107.60 |
| CD(20/0) |  | 0.99046 | 1.0224 | 1.0041 | 0.99614 | 1.02 | 1.0205 |
| CD(40/0) |  | 0.97493 | 1.0219 | 1.0286 | 1.0213 | 1.000 | 1.0005 |

Figure 5A:
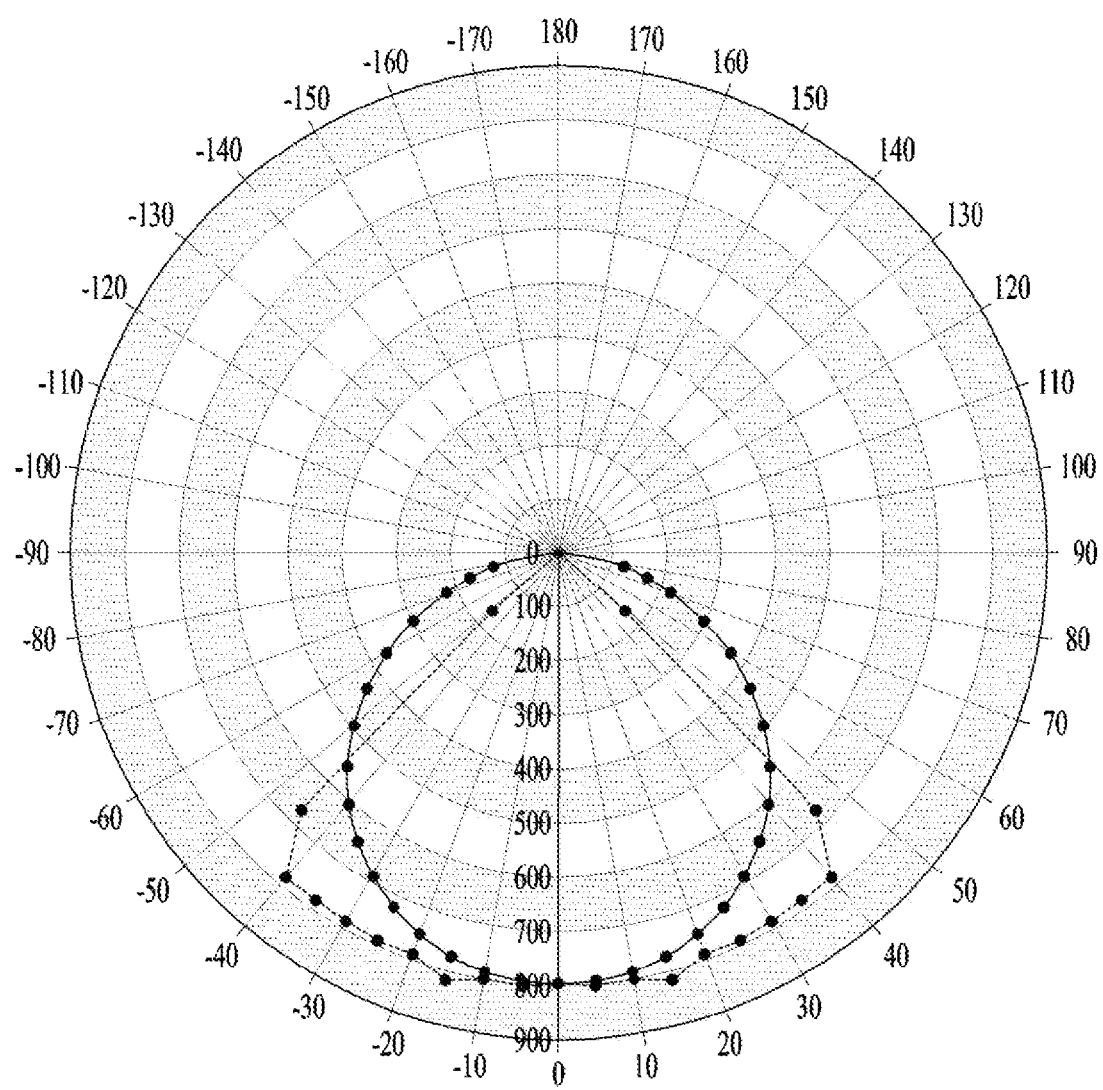
FIGS. 5a to 5f illustrate the distribution of light discharged from a lighting device having a lens disposed therein according to Comparative Examples 1 to 6.

In Comparative Example 1, the product of the HR of the light entrance surface and the HR of the light exit surface is equal to or less than 1.45, and the CD(40/0) has a value equal to or less than 0.98. As illustrated in FIG. 5a, the luminosity measured at the region angularly spaced apart from the top surface of the light-emitting element by an angle of 40 degrees is equal to or less than 98% of the luminosity measured at the top surface of the light-emitting element.

Figure 5B:
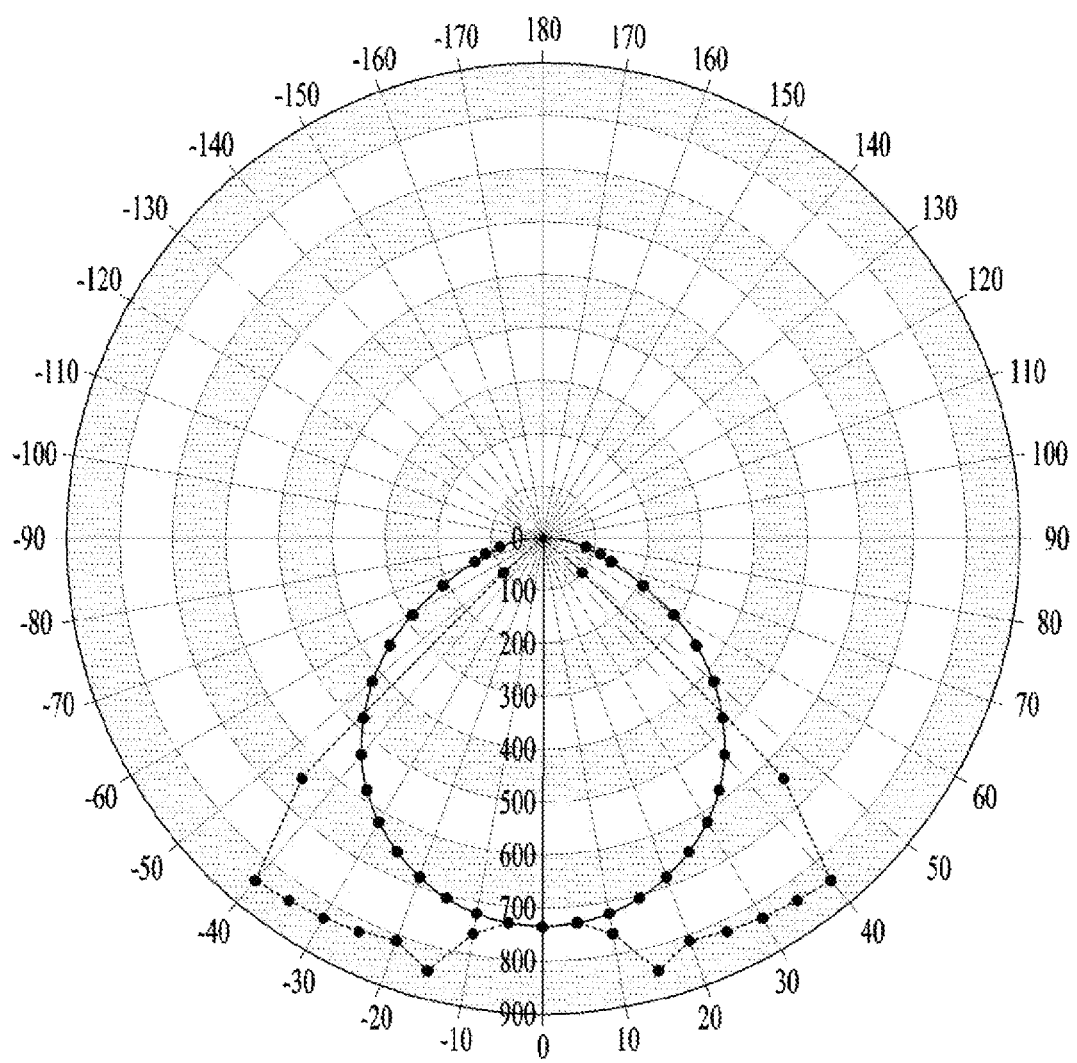

In Comparative Example 2, the product of the HR of the light entrance surface and the HR of the light exit surface is equal to or greater than 1.66, and the CD(20/0) and the CD(40/0) have values equal to or greater than 1.02. As illustrated in FIG. 5b, the luminosities measured at the regions angularly spaced apart from the top surface of the light-emitting element by angles of 20 degrees and 40 degrees are equal to or greater than 102% of the luminosity measured at the top surface of the light-emitting element.

Figure 5C:
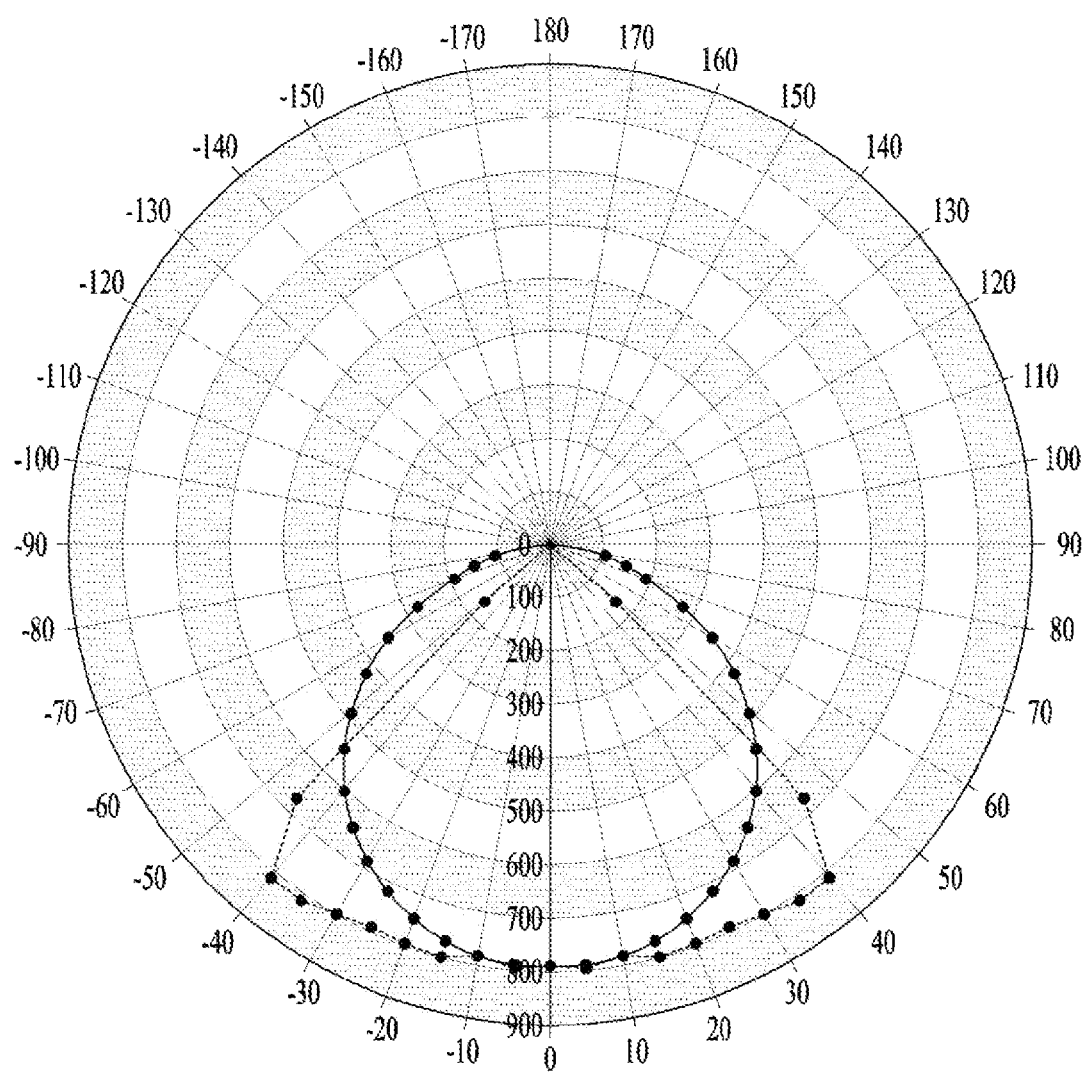

In Comparative Example 3, the product of the TR of the light entrance surface and the TR of the light exit surface is equal to or less than 0.75, and the CD(40/0) has a value equal to or greater than 1.02. As illustrated in FIG. 5c, the luminosity measured at the region angularly spaced apart from the top surface of the light-emitting element by an angle of 40 degrees is equal to or greater than 102% of the luminosity measured at the top surface of the light-emitting element.

Figure 5D:
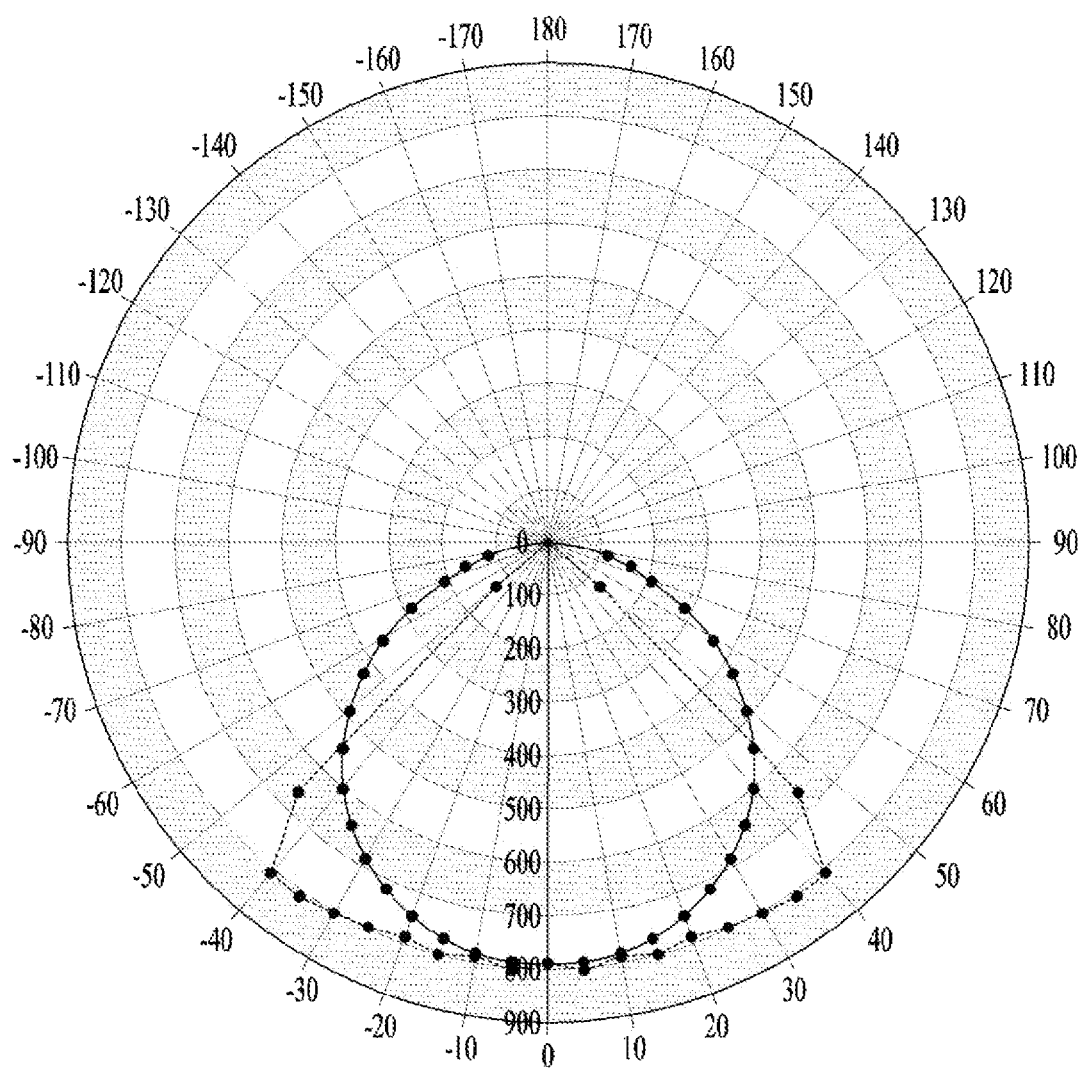

In Comparative Example 4, the product of the TR of the light entrance surface and the TR of the light exit surface is equal to or less than 0.75, and the CD(40/0) has a value equal to or greater than 1.02. As illustrated in FIG. 5d, the luminosity measured at the region angularly spaced apart from the top surface of the light-emitting element by an angle of 40 degrees is equal to or greater than 102% of the luminosity measured at the top surface of the light-emitting element.

Figure 5E:
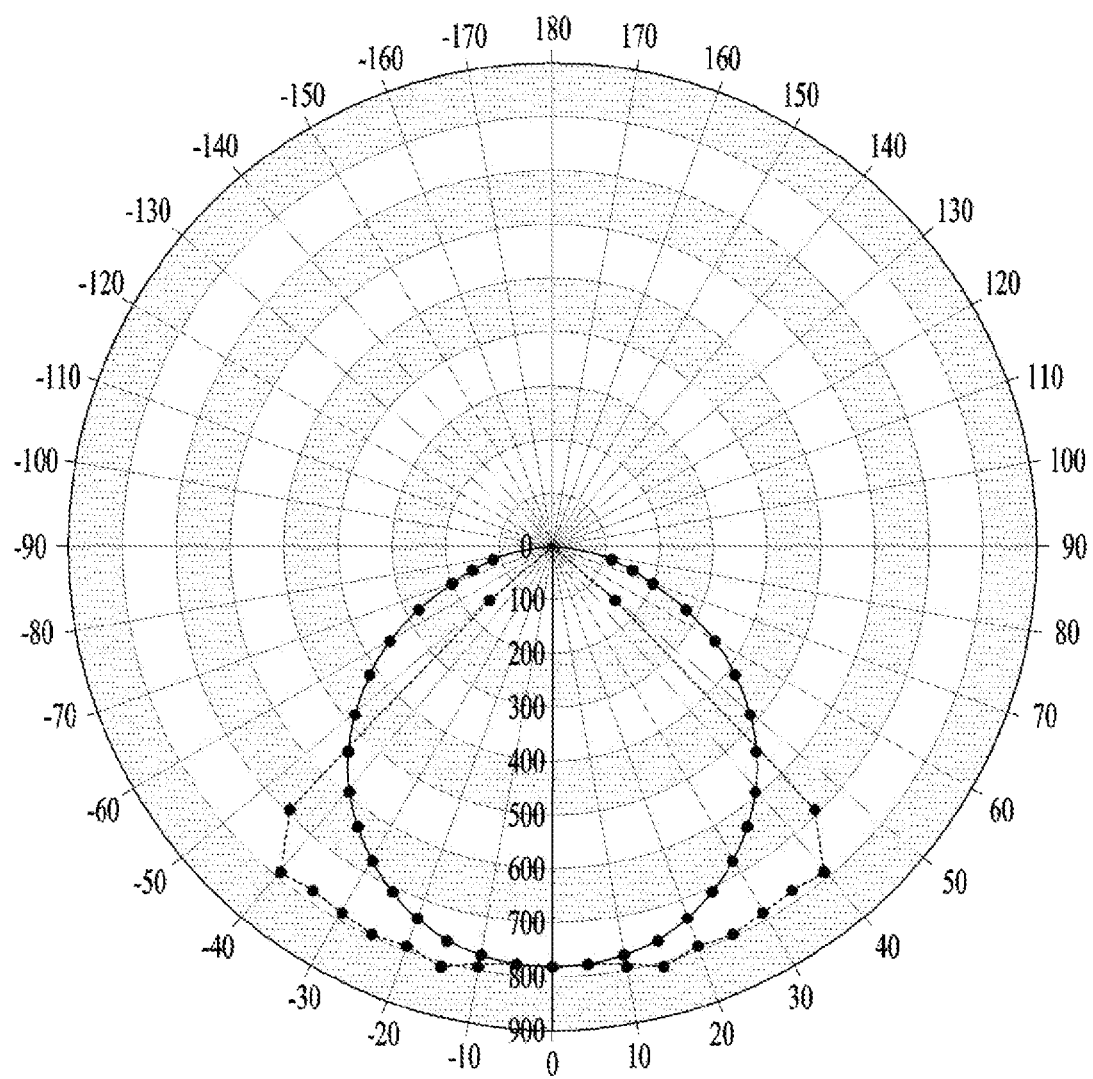

In Comparative Example 5, the product of the TR of the light entrance surface and the TR of the light exit surface is equal to or greater than 0.96, and the CD(20/0) has a value equal to or greater than 1.02. As illustrated in FIG. 5e, the luminosity measured at the region angularly spaced apart from the top surface of the light-emitting element by an angle of 20 degrees is equal to or greater than 102% of the luminosity measured at the top surface of the light-emitting element.

Figure 5F:
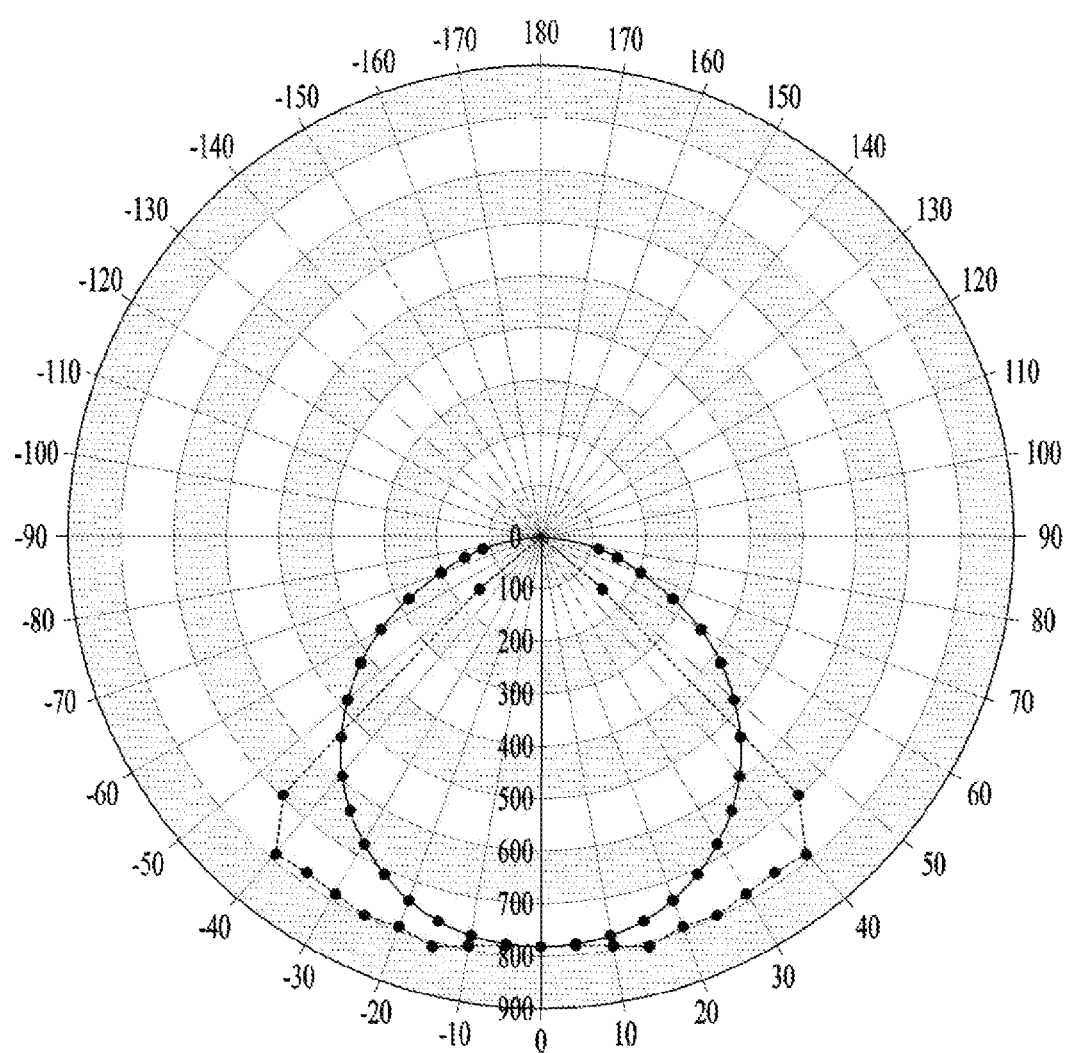

In Comparative Example 6, the product of the TR of the light entrance surface and the TR of the light exit surface is equal to or greater than 0.96, and the CD(20/0) has a value equal to or greater than 1.02. As illustrated in FIG. 5f, the luminosity measured at the region angularly spaced apart from the top surface of the light-emitting element by an angle of 20 degrees is equal to or greater than 102% of the luminosity measured at the top surface of the light-emitting element.

The lighting device having the lens according to the embodiments exerts uniform luminosity within a range from 80 degrees to 90 degrees in a first direction and creates consistent light distribution in a second direction. As such, the lighting device may be used as a uniform light source having a line shape when it is disposed inside a refrigerator, or the like.

The above description merely describes the technical sprit of the embodiments by way of example, and various modifications and substitutions related to the above description are possible by those skilled in the art without departing from the scope and spirit of the disclosure. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

INDUSTRIAL APPLICABILITY

A lighting device having a lens according to the embodiments may be used as a uniform light source having a line shape when it is disposed inside a refrigerator, or the like.

The invention claimed is:

1. A lens comprising;
a light entrance surface; and
a light exit surface facing the light entrance surface,
wherein a product of a height rate (HR) of the light entrance surface and an HR of the light exit surface on a cross section in a first direction ranges from 1.45 to 1.66,
where the HR of the light entrance surface is h0/h1, "h0" denotes a distance from a reference line to the light entrance surface corresponding to a center axis, and "h1" denotes a height from the reference line to a midpoint of a straight line, which interconnects regions P11 and P12 on the light entrance surface that correspond to points at one-third and two-thirds of a distance from one end of the reference line to the center axis, respectively, and
where the HR of the light exit surface is h3/h2, "h3" denotes a distance from the reference line to the light exit surface corresponding to the center axis, and "h2" denotes a height from the reference line to a midpoint of a straight line, which interconnects regions P21 and P22 on the light exit surface that correspond to points at one-third and two-thirds of the distance from the one end of the reference line to the center axis, respectively.

2. The lens according to claim 1, wherein a product of a tangential rate (TR) of the light entrance surface and a TR of the light exit surface on the cross section in the first direction ranges from 0.75 to 0.96,
where the TR of the light entrance surface is $\theta 0/\theta 1$, "$\theta 0$" denotes an angle between the reference line and a straight line, which connects the one end of the reference line to a region of the light entrance surface corresponding to the center axis, and "$\theta 1$" denotes an angle between the reference line and the straight line, which interconnects the regions P11 and P12 on the light entrance surface that correspond to the points at one-third and two-thirds of the distance from the one end of the reference line to the center axis, respectively, and
where the TR of the light exit surface is $\theta 3/\theta 2$, "$\theta 3$" denotes an angle between the reference line and a straight line, which connects one end of the light exit surface to a region of the light exit surface corresponding to the center axis, and "$\theta 2$" denotes an angle between the reference line and the straight line, which interconnects the regions P21 and P22 on the light exit surface that correspond to the points at one-third and two-thirds of the distance from the one end of the reference line to the center axis, respectively.

3. The lens according to claim 1, wherein the light entrance surface and the light exit surface are symmetrical to each other relative to the center axis.

4. The lens according to claim 1, wherein at least one of the light entrance surface and the light exit surface has a consistent shape in a predetermined section in a second direction crossing the first direction.

5. The lens according to claim 1, wherein the light entrance surface or the light exit surface is an aspherical surface or a spherical surface.

6. The lens according to claim 1, wherein the light entrance surface varies in curvature at the regions P11 and P12.

7. The lens according to claim 1, wherein the light exit surface varies in curvature at the regions P21 and P22.

8. The lens according to claim 1, wherein regions of the light entrance surface and the light exit surface adjacent to the regions P12 and P22 respectively are disposed farthest from the reference line.

9. The lens according to claim 1, wherein the light exit surface comprises a recess formed in a central region.

10. The lens according to claim 1, wherein the lens has an uneven thickness in a direction perpendicular to the reference line.

11. A lens comprising;
a light entrance surface; and
a light exit surface facing the light entrance surface,
wherein a product of a tangential rate (TR) of the light entrance surface and a TR of the light exit surface on a cross section in a first direction ranges from 0.75 to 0.96,
where the TR of the light entrance surface is $\theta 0/\theta 1$, "$\theta 0$" denotes an angle between a reference line and a straight line, which connects one end of the reference line to a region of the light entrance surface corresponding to a center axis, and "$\theta 1$" denotes an angle between the reference line and the straight line, which interconnects regions P11 and P12 on the light entrance surface that correspond to points at one-third and two-thirds of a distance from the one end of the reference line to the center axis, respectively, and
where the TR of the light exit surface is $\theta 3/\theta 2$, "$\theta 3$" denotes an angle between the reference line and a straight line, which connects one end of the light exit surface to a region of the light exit surface corresponding to the center axis, and "$\theta 2$" denotes an angle between the reference line and a straight line, which interconnects regions P21 and P22 on the light exit surface that correspond to points at one-third and two-thirds of the distance from the one end of the reference line to the center axis, respectively.

12. The lens according to claim 11, wherein a product of a height rate (HR) of the light entrance surface and an HR of the light exit surface on the cross section in the first direction ranges from 1.45 to 1.66,
where the HR of the light entrance surface is h0/h1, "h0" denotes a distance from the reference line to the light entrance surface corresponding to the center axis, and "h1" denotes a height from the reference line to a midpoint of the straight line, which interconnects the regions P11 and P12 on the light entrance surface that correspond to the points at one-third and two-thirds of the distance from the one end of the reference line to the center axis, respectively, and
where the HR of the light exit surface is h3/h2, "h3" denotes a distance from the reference line to the light exit surface corresponding to the center axis, and "h2" denotes a height from the reference line to a midpoint of the straight line, which interconnects the regions P21 and P22 on the light exit surface that correspond to the points at one-third and two-thirds of the distance from the one end of the reference line to the center axis, respectively.

13. The lens according to claim 11, wherein at least one of the light entrance surface and the light exit surface has a consistent shape in a predetermined section in a second direction crossing the first direction.

14. The lens according to claim 11, wherein the light entrance surface varies in curvature at the regions P11 and P12.

15. The lens according to claim 11, wherein the light exit surface varies in curvature at the regions P21 and P22.

16. The lens according to claim 11, wherein regions of the light entrance surface and the light exit surface adjacent to the regions P12 and P22 respectively are disposed farthest from the reference line.

17. The lens according to claim 11, wherein the light exit surface comprises a recess formed in a central region.

18. A lighting device comprising:
a body comprising a bottom surface and a sidewall;
a light source module disposed on the bottom surface and comprising a circuit board and a light-emitting element; and
a lens disposed on the sidewall and comprising: a light entrance surface; and a light exit surface facing the light entrance surface, wherein a product of a height rate (HR) of the light entrance surface and an HR of the light exit surface on a cross section in a first direction ranges from 1.45 to 1.66, where the HR of the light entrance surface is h0/h1, "h0" denotes a distance from a reference line to the light entrance surface corresponding to a center axis, and "h1" denotes a height from the reference line to a midpoint of a straight line, which interconnects regions P11 and P12 on the light entrance surface that correspond to points at one-third and two-thirds of a distance from one end of the reference line to the center axis, respectively, and where the HR of the light exit surface is h3/h2, "h3" denotes a distance from the reference line to the light exit surface corresponding to the center axis, and "h2" denotes a height from the reference line to a midpoint of a straight line, which interconnects regions P21 and P22 on the light exit surface that correspond to points at one-third and two-thirds of the distance from the one end of the reference line to the center axis, respectively.

19. The lighting device according to claim 18, wherein at least one of the light entrance surface and the light exit surface has a consistent shape in a predetermined section in a second direction crossing the first direction.

20. The lighting device according to claim 18, wherein the light entrance surface of the lens comes into contact with the sidewall at opposite ends thereof in the first direction.

* * * * *